United States Patent
Kang et al.

(10) Patent No.: US 10,244,645 B2
(45) Date of Patent: Mar. 26, 2019

(54) ELECTRONIC CONTROL UNIT WITH A HOUSING STABILIZING ELEMENT AND HOUSING FOR ELECTRONIC CONTROL UNIT

(71) Applicant: CONTINENTAL AUTOMOTIVE GMBH, Hannover (DE)

(72) Inventors: Alan Kang, Rochester Hills, MI (US); Thomas Riepl, Bad Abbach (DE); Marius Tarnovetchi, Timisoara (RO)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 15/714,494

(22) Filed: Sep. 25, 2017

(65) Prior Publication Data

US 2018/0014418 A1    Jan. 11, 2018

Related U.S. Application Data

(63) Continuation of application No. PCT/EP2016/056086, filed on Mar. 21, 2016.

(30) Foreign Application Priority Data

Mar. 26, 2015  (EP) .................... 15465507

(51) Int. Cl.
  *H05K 5/00*  (2006.01)
  *H05K 5/03*  (2006.01)
(52) U.S. Cl.
  CPC .......... *H05K 5/0056* (2013.01); *H05K 5/006* (2013.01); *H05K 5/0017* (2013.01);
  (Continued)

(58) Field of Classification Search
  CPC .... H05K 5/0056; H05K 5/0017; H05K 5/006; H05K 5/03; H05K 5/0052
  (Continued)

(56) References Cited

U.S. PATENT DOCUMENTS 5,111,362 A * 5/1992 Flamm .................. H05K 7/142
                                                      220/4.02
5,991,164 A * 11/1999 Saito .................. H01T 4/08
                                                      174/51

(Continued)

FOREIGN PATENT DOCUMENTS

DE      19712099 A1    5/1998
DE   1020090443177 A1  4/2011
(Continued)

OTHER PUBLICATIONS

International Search Report and Written Opinion dated Jun. 13, 2016 from corresponding International Patent Application No. PCT/EP2016/056086.

(Continued)

*Primary Examiner* — Hung S. Bui

(57) ABSTRACT

An electronic control unit having a sealed housing including a main body and a cover fixed to one another and a sealing element in contact with one and/or the other of the main body and the cover. The control unit also includes a circuit board arrangement in the housing which a circuit board is located. In addition, the control unit also includes at least one housing stabilizing element in contact with the circuit board arrangement and one or the other of the main body and the cover.

6 Claims, 2 Drawing Sheets

(52) U.S. Cl.
CPC ......... *H05K 5/0047* (2013.01); *H05K 5/0052* (2013.01); *H05K 5/03* (2013.01)

(58) Field of Classification Search
USPC ................................. 361/728–730, 759, 796
See application file for complete search history.

(56) References Cited

U.S. PATENT DOCUMENTS

| | | | | |
|---|---|---|---|---|
| 6,242,690 | B1* | 6/2001 | Glover | H05K 9/0037 |
| | | | | 174/367 |
| 6,366,465 | B1* | 4/2002 | Baur | H05K 7/142 |
| | | | | 211/41.17 |
| 6,839,240 | B2* | 1/2005 | Skofljanec | H05K 7/142 |
| | | | | 361/679.01 |
| 7,561,435 | B2* | 7/2009 | Kamoshida | H05K 5/0052 |
| | | | | 174/50.5 |
| 7,567,441 | B2* | 7/2009 | Monda | H05K 7/142 |
| | | | | 361/752 |
| 7,570,496 | B2* | 8/2009 | Chen | H05K 9/006 |
| | | | | 174/350 |
| 8,000,111 | B2* | 8/2011 | Liao | H05K 7/142 |
| | | | | 361/726 |
| 8,054,640 | B2* | 11/2011 | Monda | G01R 31/2812 |
| | | | | 361/752 |
| 8,896,994 | B2* | 11/2014 | Abe | G06F 1/162 |
| | | | | 349/58 |
| 9,056,596 | B2* | 6/2015 | Nagashima | B60T 7/042 |
| 9,128,314 | B2* | 9/2015 | Yoon | G02F 1/133308 |
| 9,276,350 | B1* | 3/2016 | Wang | H01R 13/5202 |
| 9,723,740 | B2* | 8/2017 | Yang | H05K 7/1427 |
| 2008/0310130 | A1* | 12/2008 | Monda | G01R 31/2812 |
| | | | | 361/752 |
| 2011/0315580 | A1 | 12/2011 | Abe et al. | |

FOREIGN PATENT DOCUMENTS

| | | |
|---|---|---|
| DE | 102009054758 A1 | 6/2011 |
| DE | 102013203986 A1 | 9/2014 |
| EP | 2429273 A2 | 3/2012 |

OTHER PUBLICATIONS

European Search Report dated Oct. 7, 2015 for corresponding European Patent Application No. 15465507.0.

* cited by examiner

ELECTRONIC CONTROL UNIT WITH A HOUSING STABILIZING ELEMENT AND HOUSING FOR ELECTRONIC CONTROL UNIT

CROSS-REFERENCE TO RELATED APPLICATIONS

This application claims the benefit of PCT Application PCT/EP2016/056086, filed Mar. 21, 2016, which claims priority to European Application 15465507.0 filed Mar. 26, 2015. The disclosures of the above applications are incorporated herein by reference.

FIELD OF THE INVENTION

The invention relates to a housing for an electronic control unit, for example for automotive applications, and to an electronic control unit.

BACKGROUND OF THE INVENTION

Electronic components, for example printed circuit boards, of an electronic control unit normally need to be protected from the surrounding environment which could be dangerous for the normal functioning of the electronic components, for example due to the presence of pollutants, such as dust, water or oil. For this reason electronic components may be contained in the inner volume of a housing, which is sealed to prevent contact with the external environment.

Conventional housings for electronic control units comprise a main body and a cover which are joined together along a border. Along the border area of contact between the main body and the cover, the housing comprises a sealing element, for example constituted by a gasket, an O-ring or a viscous dispensed material. The sealing element prevents pollutants, such as dust, water or oil from entering the housing through the border area.

The housing is normally subject to temperature variations, due to both self-heating of the electronic control unit and to variations in the climate conditions of the external environment. Accelerated tests to which electronic control units are subjected create even harsher temperature conditions. Differences in temperature between the sealed inner volume of the housing and the external environment may in turn cause pressure differences between a gas inside the housing and the ambient atmosphere surrounding the housing.

Due to differences in the coefficients of thermal expansion of the main body and of the cover and to positive or negative differences between internal and external pressure (overpressure or under-pressure, respectively), the housing is subject to mechanical stress. Such stress may cause deformation of the parts, in particular the cover, which are thinner in comparison with other parts, in particular the main body. As a result, this may cause stress on the sealing element between the main body and the cover, which may result into an adhesion or a cohesion sealant failure.

SUMMARY OF THE INVENTION

It is an object of the present invention to provide a control unit with a housing which has a particularly small risk of damage to the sealing element between the cover and the main body of the housing due to mechanical stress.

The object is achieved by an electronic control unit according to the independent claim. The dependent claims describe advantageous developments and modifications of the control unit.

According to a first aspect of the present invention, an electronic control unit is disclosed. The electronic control unit comprises a sealed housing including a main body and a cover fixed to one another and a sealing element in contact with one and/or the other of the main body and the cover. In particular the sealing element is in contact with both, the main body and the cover. The sealing element is preferably positioned at an interface of the main body with the cover for sealing the interface. The main body and/or the cover may have a groove for accommodating the sealing element at least in part.

Further, the electronic control unit comprises a circuit board arrangement in the housing. The circuit board arrangement comprises a circuit board. The circuit board is for example a printed circuit board.

The sealed housing further comprises at least one housing stabilizing element in contact with the circuit board arrangement and one or the other of the main body and the cover.

According to a second aspect, a housing for an electronic control unit, the electronic control unit comprising a circuit board arrangement, is disclosed. The housing comprises a main body, a cover fixed to the main body, a sealing element in contact with one and/or the other of the main body and the cover, and at least one housing stabilizing element for contacting the circuit board arrangement and one or the other of the main body and the cover.

The housing stabilizing element(s) between the circuit board arrangement inside the housing and the housing itself provide(s) an additional fixation to the housing assembly, thus limiting deformation and therefore preventing adhesion or a cohesion sealant failure of the sealing element which is provided between the main body and the cover. As a further advantage, the housing described above is characterized by a high degree of stiffness, showing improved vibration performances.

As a consequence, additional fixations between the cover and the main body of the housing, provided to avoid permanent deformations and to limit the displacements to the elastic domain, may be advantageously be dispensed with. For example, additional internal walls or posts of the housing rising from the main body and supporting the cover within the inner volume of the housing may be omitted. The presence of additional internal walls or posts would reduce the space available for the electronic circuit inside the inner volume. In addition, the presence of additional internal walls makes the main body of the housing more complex and therefore more expensive.

Additional fixation means between the cover and the main body—such as screws, rivets or the like may also be omitted. The presence of additional fixations between the sheet metal cover and the main body of the housing makes the coupling of the cover to the main body longer. Such additional fixation means may also increase the risk for reliability issues, e.g. due to the additional sealing area required in the regions where they penetrate for example from the outside through the cover into the main body.

In one embodiment, the housing stabilizing element(s) overlap(s) the circuit board in top view on a main surface of the circuit board. In this way, the housing stabilizing element is particularly space saving.

According to one embodiment, the circuit board arrangement comprises one or more fixing elements for fixing the circuit board to one of the main body or the cover. In one development, the fixing elements are screws. The housing stabilizing element or at least one of the housing stabilizing elements is preferably interposed between and in mechanical contact with one of the fixing elements and the other one of the main body and the cover. In particular, the fixing elements are screws and the housing stabilizing element is interposed between the other one of the main body and the cover and a head of one of the screws.

The fixing elements may protrude from the circuit board, for example the heads of the screws for fixing circuit boards protrude from the circuit board, thus reducing the gap which the housing stabilizing element has to bridge to contact the housing at a side remote from the circuit board arrangement. Therefore, the thickness of the housing stabilizing element(s) may be particularly small.

According to one embodiment, the circuit board is fixed to the main body and the housing stabilizing element is interposed between the circuit board and the cover of the sealed housing. Advantageously, this facilitates an easy assembly of the electronic control unit. In a method for producing the electronic control unit, the circuit board is fixed on the main body first, one or more housing stabilizing elements is provided on the circuit board arrangement and finally the cover may be fixed to the main body.

In one embodiment, the fixing elements fix the circuit board to the main body and the housing stabilizing element or at least one of the housing stabilizing elements is interposed between the cover and one of the fixing elements. In particular, the fixing elements may be screws and a housing stabilizing element is interposed between the cover and at least one head of the screws. Advantageously, this allows providing the housing stabilizing elements over stiffening elements, i.e. over fixing elements which have to be present to assure the fixing of the circuit board to the main body of the housing.

According to further embodiments, the cover comprises at least one indentation. The housing stabilizing element or at least one of the housing stabilizing elements is interposed between the indentation and the circuit board. In other words, the housing stabilizing element(s) is/are sandwiched between the circuit board arrangement and the indentation(s). In particular, at least one of the housing stabilizing elements is interposed between the indentation and a respective head of a respective screw, fixing the circuit board to the main body of the housing. Advantageously, indentations further help in achieving a particularly small gap between the circuit board and the cover of the housing, thus a particularly small thickness of the housing stabilizing element(s) is achievable.

According to further embodiments, the fixing elements or at least one fixing element in contact with a respective housing stabilizing element is positioned in correspondence to the portions of the sealed housing having the highest deformability. For example, the fixing element may be positioned in correspondence to an area lacking mechanical fixation—for example a center area of the cover in top view on a main surface of the circuit board—thus improving stiffness and vibration performances.

According to a further embodiment, the fixing element or at least one fixing element in contact with a respective housing stabilizing element is positioned close to the border portion of the sealed housing. For example, it is positioned adjacent to an edge region of the circuit board. Advantageously, this improves the resistance of the assembly in case of drop.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The aspects defined above and further aspects of the present invention are apparent from the examples of embodiment to be described hereinafter and are explained with reference to the exemplary embodiments. The invention will be described in more detail hereinafter with reference to exemplary embodiments to which the invention is not limited. Rather, it comprises any combination of elements of different embodiments. Moreover, the invention comprises any combination of claims and any combination of features disclosed by the claims.

DETAILED DESCRIPTION OF THE PREFERRED EMBODIMENTS

The following description of the preferred embodiment(s) is merely exemplary in nature and is in no way intended to limit the invention, its application, or uses.

Figure 1:
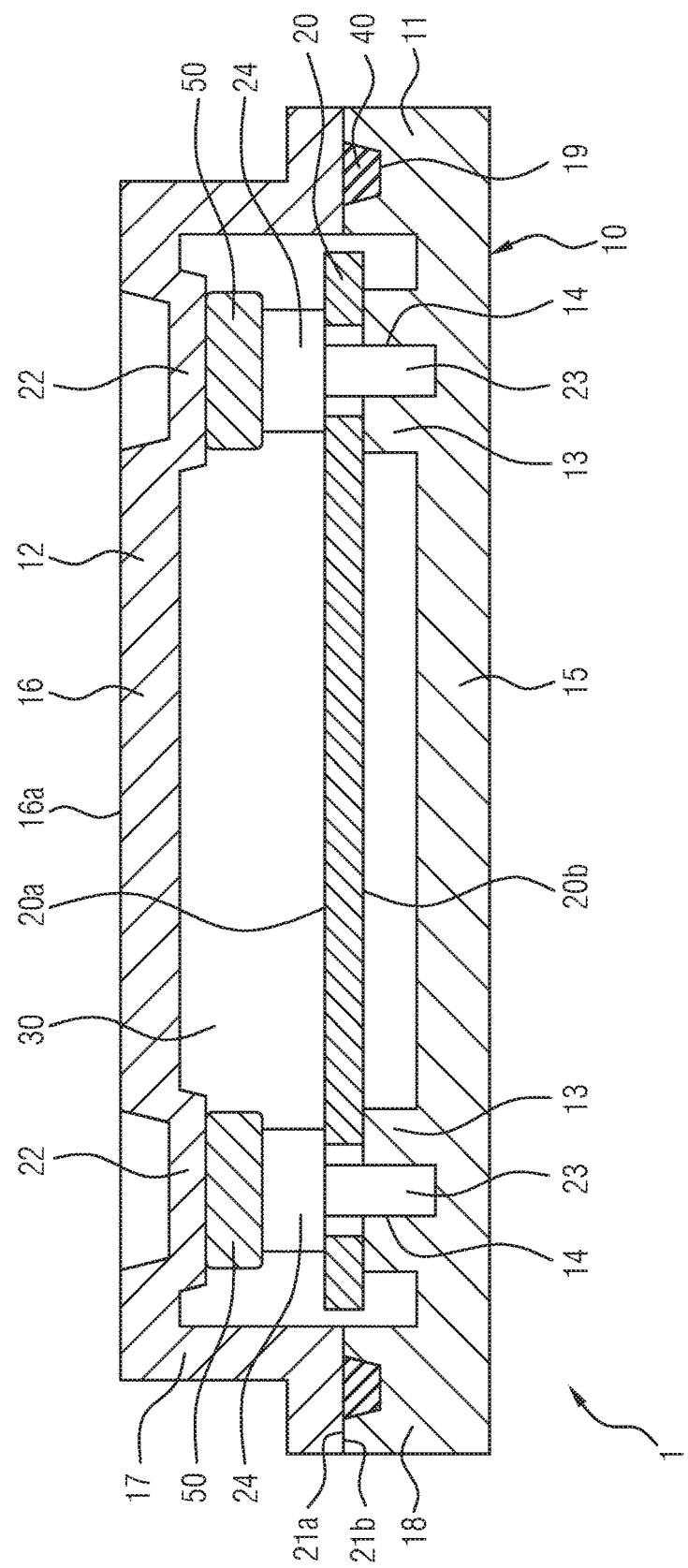
FIG. 1 is a sectional view of an electronic control unit according to a first exemplary embodiment of the present invention.

FIG. 1 shows an electronic control unit 1 according to a first exemplary embodiment of the present invention. The electronic control unit 1 comprises a housing 10 and a circuit board arrangement inside the housing 10.

Figure 2:
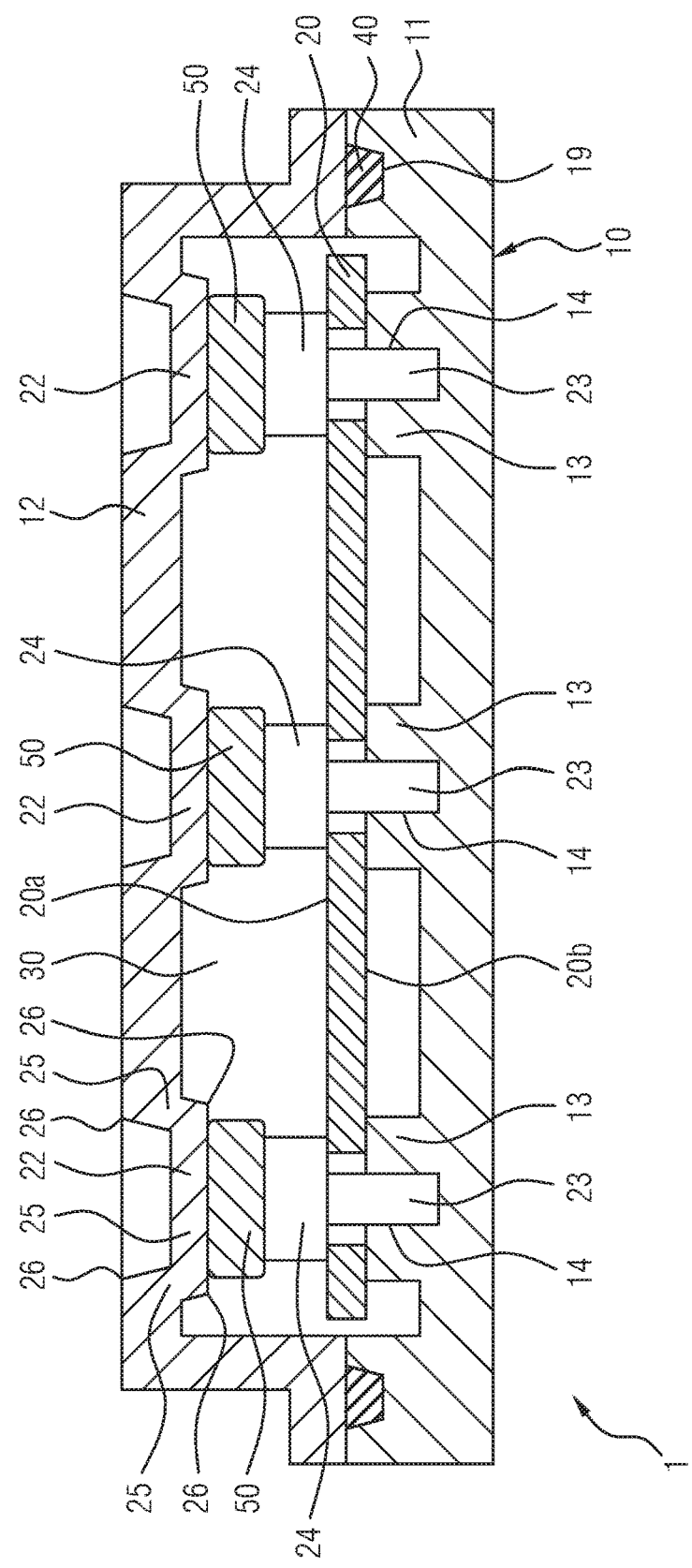
FIG. 2 is a sectional view of an electronic control unit according to a second exemplary embodiment the present invention.

FIG. 2 shows an electronic control unit 1 according to a second exemplary embodiment of the present invention. The electronic control unit 1 according to the second embodiment corresponds in general to the electronic control unit 1 according to the first embodiment. Differences between the two embodiments are discussed below.

The circuit board arrangement comprises a printed circuit board 20 and a plurality of fixing elements 23 which fix the circuit board 20 to the housing 10.

The housing 10 comprises a main body 11 and a cover 12 joined together. The main body 11 is made of a plastic or metal material. It may be a molded part. The cover 12 is typically made of a metal sheet, of the same or of a different material with respect to the main body 11. The housing 10 comprises a connector (not shown) for connecting the printed circuit board 20 inside the housing 10 to an external source of connection—such as a wire harness—for providing power and/or data exchange.

The main body 11 has a base 15 and a perimeter wall 18 rising from the base 15. The base 15, seen from a top or bottom view (not shown) orthogonal to the sectional views of FIGS. 1 and 2, may of rectangular shape, circular shape or other shapes. The perimeter wall 18 is orthogonal to the base 15. According to different embodiments of the present invention (not shown) the perimeter wall 18 may be otherwise inclined and/or curved with respect to the base 15.

The cover 12 has a top surface 16 and a perimeter wall 17 protruding from the top surface 16. The perimeter wall 17 is orthogonal to the top surface 16. According to different embodiments of the present invention (not shown) the perimeter wall 17 of the cover 12 may be otherwise inclined and/or curved with respect to the top surface 16. According to different embodiments of the present invention (not shown) the perimeter wall 17 of the cover 12 may not be present.

On top of the perimeter wall 18, the cover 12 is supported and fixed in order to create a hollow structure with an inner volume 30 extending between the base 15, the perimeter wall 18 and the cover 12. The inner volume 30 is subject to house the printed circuit board 20. The inner volume 30 may house a plurality of further electronic components (not shown).

On top of the perimeter wall 18, a planar border portion 21a is defined for the coupling with a correspondent planar border portion 21b at the end of the perimeter wall 17 of the cover 12. In embodiments where the perimeter wall 17 of the cover 12 are not present, the planar border portion 21b is provided directly along the border of top surface 16 of the cover 12.

Border portions 21a, 21b, which are not planar are also conceivable. However, also non-planar border portions 21a, 21b may expediently be configured for establishing a form—fit connection between the main body 11 and the cover 12.

On the border portion 21a the perimeter wall 18 of the main body 11 includes a seat 19 for a perimeter sealing element 40 made of a sealant material. For example, the sealing element 40 may be constituted by an O-ring or a formed-in-place gasket made from a fluid sealing compound. The seat 19 and the sealing element 40 are trapezoidal in cross-sectional shape, but other shapes are in general also possible, for example shapes as a circular sector or a rectangle.

When the main body 11 and the cover 12 are joined together, the sealing element 40 is interposed between the top of the perimeter wall 18 and the cover 12, preventing contamination, for example dust or other pollutants, to the inner volume 30 from the external environment.

The main body 11 has a plurality of supports 13 rising from the base 15 for supporting the printed boarded circuit 20. In each of the supports 13 a coupling element 14 for one of the fixing elements 23 is provided. When the printed circuit board 20 is supported on the supports 13, the coupling of the fixing elements 23 to the respective coupling elements 14 assures that the printed boarded circuit 20 is fixed to the main body 11 of the housing 10.

In the embodiments of FIGS. 1 and 2, the fixing elements 23 are screws and coupling elements 14 are threaded holes. Each screw 23 comprises a head 24, protruding from the printed boarded circuit 20 in a direction away from the supports 13 when the printed boarded circuit 20 is fixed to the main body 11 of the housing 10. In other words, the supports 13, the circuit board 20 and the heads 24 follow one another in this order in a direction normal to a main surface of the circuit board 20 towards the cover 12.

In FIG. 1, two supports 13 are shown, laterally adjacent to the border portion 21a, 21b. In the more stiffened embodiment of FIG. 2, three supports 13 are shown. The additional support 13—with respect to the supports 13 shown in FIG. 1—is placed in a central area 16a of the top surface 16 of the cover 12, where no other mechanical fixation is present, i.e. the portion of the top surface 16 having the highest deformability. The additional support 13 provides improved stiffness and response to vibrations, for applications where this may be desirable. In general, according to other embodiments of the present invention, any number of supports may be foreseen for reaching the desired level of stiffness.

The printed circuit board 20 comprises a top main surface 20a, opposite to a bottom main surface 20b, which is subject to contact the supports 13. Between the top main surface 20a and the cover 12, one or more housing stabilizing element 50 are interposed between the printed circuit board 20 and the cover 12 of the sealed housing 10.

As shown in the embodiments of FIGS. 1 and 2, each housing stabilizing element 50 is interposed between the cover 12 and one of the fixing elements 23, in particular between the cover 12 and a respective head 24 of a respective screw 23. Specifically, opposite sides of the housing stabilizing elements 50 are in direct mechanical contact with the cover 12 and the corresponding heads 24, respectively. The housing stabilizing elements 50 are made of adhesive glue or of a sealant material formed-in-place gasket made from a fluid sealing compound. The housing stabilizing elements 50—as well as the heads 24—laterally overlap the circuit board 20 and also the supports 13 in top view of the top main surface 20a.

The cover 12 comprises one or more indentations 22, protruding, when the electronic control unit 1 is assembled, towards the printed circuit board 20. According to possible embodiments of the present invention, each of the housing stabilizing elements 50 are interposed between a respective indentation 22 and the circuit board 20. In particular, in the embodiments of FIGS. 1 and 2, each of the housing stabilizing elements 50 are interposed between and in mechanical contact with a respective indentation 22 and a respective head 24 of a respective screw 23. Each indentation 22 laterally overlaps a corresponding housing stabilizing element 50, a corresponding screw head 24, the circuit board 20 and a corresponding support 13 in top view onto the top main surface 20a.

The indentation 22 has a trapezoidally shaped cross-section, comprising three consecutive linear segments 25 and four corners 26, linking the segments 25 with one another and with the other portions of the cover 12, for example, in the embodiment of FIG. 1, central area 16a of the top surface 16. The trapezoidally shaped section of each indentation 22 comprises:

a first segment 25 (i.e. a sidewall) inclined with respect to the top surface 16 towards the inner volume 30 and linked to the top surface 16 by means of a first corner 26, a second segment 25 (i.e. a bottom wall) parallel to the top surface 16 and linked to the first segment 25 by means of a second corner 26, a third segment 25 (i.e. a further sidewall) linked to the second segment 25 by means of a third corner 26 and linked to the top surface 16 by means of a fourth corner 26.

The bottom wall 25 of each indentation 22 is directly in contact with a respective housing stabilizing element 50.

In general any other shape, for example a curved shape, may be used in the indentations 22 of the cover 12 for obtaining an area which, in the assembly of the electronic control unit 1 is closer to the printed boarded circuit 20, thus permitting to control the gap between the cover 12 and the printed boarded circuit 20 and consequently the thickness of the housing stabilizing elements 50.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An electronic control unit comprising:
   a sealed housing;
   a main body being part of the sealed housing;

a base being part of the main body;

a plurality of supports being part of the main body, the plurality of supports rising from the base;

a cover attached to the main body, the cover being part of the sealed housing and comprising at least one indentation;

a sealing element in contact with the main body and the cover;

a circuit board arrangement located in the sealed housing;

a circuit board fixed to the main body, the circuit board being part of the circuit board arrangement;

at least one housing stabilizing element being part of the sealed housing, the at least one housing stabilizing element in contact with the circuit board arrangement and the cover such that the at least one housing stabilizing element is interposed between the circuit board and the cover of the sealed housing; and one or more fixing elements being part of the circuit board arrangement, each fixing element comprising a coupling element, a plurality of screws, and a head, the at least one housing stabilizing element being interposed between and in mechanical contact with a head of the one of the fixing elements and the cover, each support of the plurality of supports receives the coupling element of the one or more fixing elements, and each of the plurality of screws having at least one head, wherein the at least one housing stabilizing element is interposed between the cover and the at least one head of each of the plurality of screws;

wherein the one or more fixing elements connects the circuit board to the main body and wherein at least one housing stabilizing element is interposed between the at least one indentation and one of the at least one head of one of the plurality of screws.

2. The electronic control unit of claim 1, wherein the at least one housing stabilizing element is interposed between the indentation and the circuit board.

3. The electronic control unit of claim 1, wherein the fixing elements in contact with the housing stabilizing elements are positioned in correspondence to portions of the sealed housing having the highest deformability.

4. The electronic control unit of claim 1, further comprising:

a first border portion formed as part of the main body; and a second border portion formed as part of the cover;

wherein the fixing elements in contact with the housing stabilizing elements are positioned close to the border portions of the sealed housing.

5. The electronic control unit of claim 1, the housing stabilizing elements further comprising adhesive glue.

6. The electronic control unit of claim 1, the housing stabilizing elements further comprising a sealant material.

* * * * *